US012618876B2

(12) United States Patent
Kern

(10) Patent No.: US 12,618,876 B2
(45) Date of Patent: May 5, 2026

(54) SUPERPARAMAGNETIC TRANSDUCER AND CORRESPONDING MAGNETIC FIELD FLOW SENSOR FOR MEASURING A DIRECT CURRENT

(71) Applicant: SOCOMEC, Benfeld (FR)

(72) Inventor: Christian Kern, Kaysersberg Vignoble (FR)

(73) Assignee: SOCOMEC, Benfeld (FR)

( * ) Notice: Subject to any disclaimer, the term of this patent is extended or adjusted under 35 U.S.C. 154(b) by 0 days.

(21) Appl. No.: 19/123,512

(22) PCT Filed: Nov. 23, 2023

(86) PCT No.: PCT/EP2023/082783
§ 371 (c)(1),
(2) Date: Apr. 23, 2025

(87) PCT Pub. No.: WO2024/132354
PCT Pub. Date: Jun. 27, 2024

(65) Prior Publication Data
US 2026/0110712 A1     Apr. 23, 2026

(30) Foreign Application Priority Data
Dec. 22, 2022     (FR) ...................................... 2214299

(51) Int. Cl.
*G01R 15/18*     (2006.01)
*G01R 15/20*     (2006.01)
*G01R 19/00*     (2006.01)

(52) U.S. Cl.
CPC ......... *G01R 15/181* (2013.01); *G01R 15/202* (2013.01); *G01R 19/0092* (2013.01)

(58) Field of Classification Search
CPC . G01R 15/181; G01R 15/202; G01R 15/0092
See application file for complete search history.

(56) References Cited

U.S. PATENT DOCUMENTS 8,076,932 B2     12/2011   Lenglet
2008/0252289 A1   10/2008   Lenglet
(Continued)

FOREIGN PATENT DOCUMENTS

EP          3477311 B1     11/2022
FR          2891917 A1     4/2007
WO      WO2022129732 A1     6/2022

*Primary Examiner* — Judy Nguyen
*Assistant Examiner* — Adam S Clarke
(74) *Attorney, Agent, or Firm* — Forge IP, PLLC

(57)     ABSTRACT

A super-paramagnetic material transducer includes: a rigid body with a longitudinal central axis and two planar surfaces at each of the opposite ends of the body in the direction of the longitudinal central axis, both of these planar surfaces being substantially perpendicular to the longitudinal central axis; and at least one support channel formed in the body and in which a super-paramagnetic coil is housed, the support channel extending parallel to the longitudinal central axis and opening onto both planar surfaces. The super-paramagnetic coil is formed by a core made of super-paramagnetic around which at least one electrical conductor is wound. Furthermore, a feedback winding formed by an electric conductor is wound on the external surface of the body and along the longitudinal central axis.

10 Claims, 10 Drawing Sheets

(56)  References Cited

U.S. PATENT DOCUMENTS

| | | | |
|---|---|---|---|
| 2012/0038360 A1 | 2/2012 | Lenglet | |
| 2015/0108974 A1 | 4/2015 | Kennedy et al. | |
| 2016/0231364 A1* | 8/2016 | Nejatali | ............. G01R 19/0092 |
| 2025/0102544 A1* | 3/2025 | Kern | .................... G01R 15/185 |

* cited by examiner

[Fig 1]
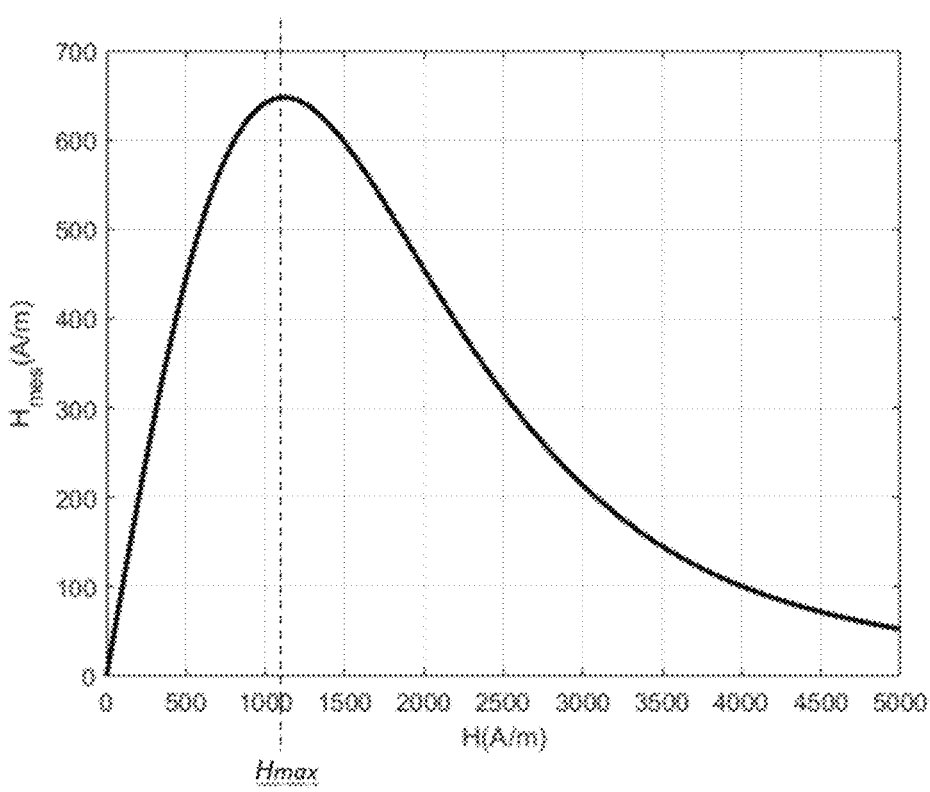
[Fig 2a]
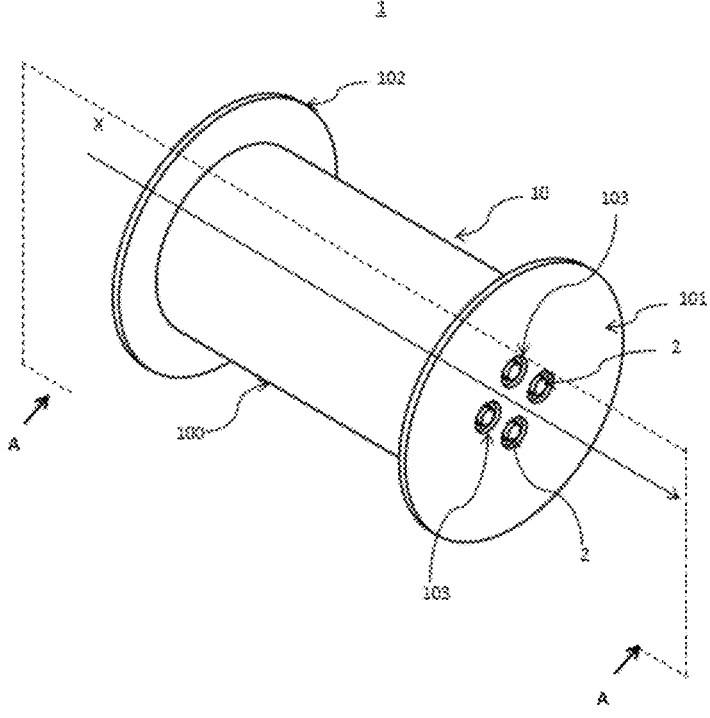

[Fig 2b]
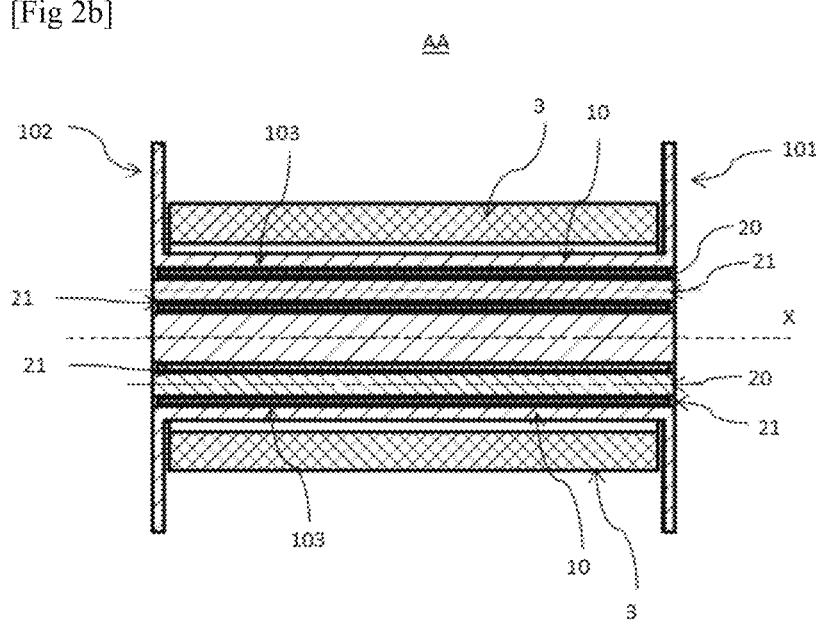
[Fig 3a]
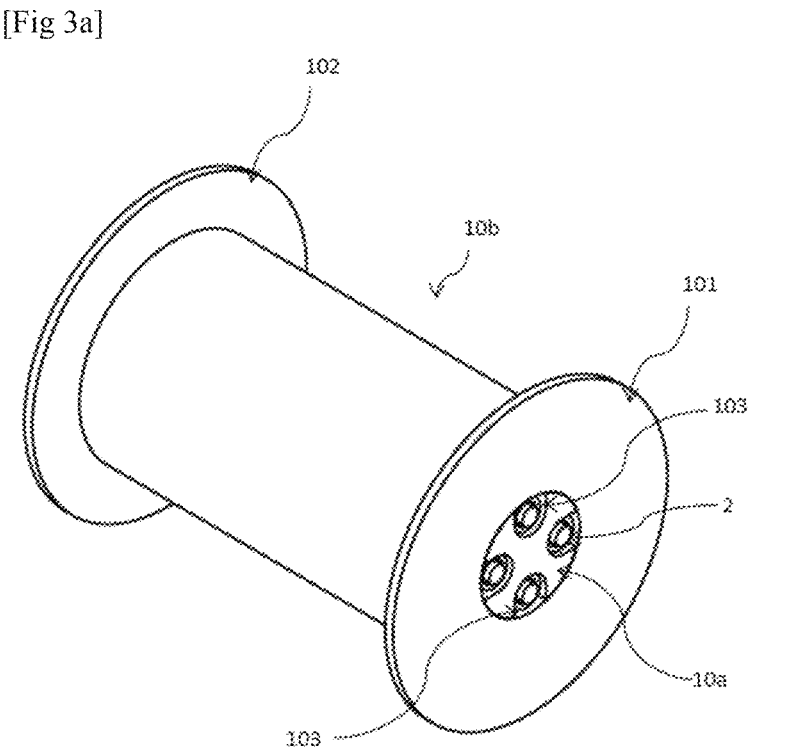

[Fig 3b]
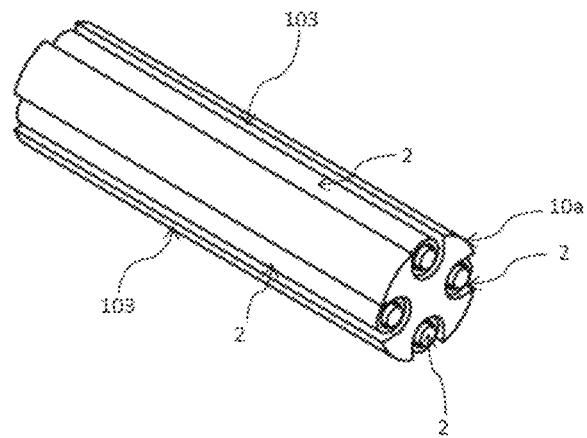
[Fig 4a]
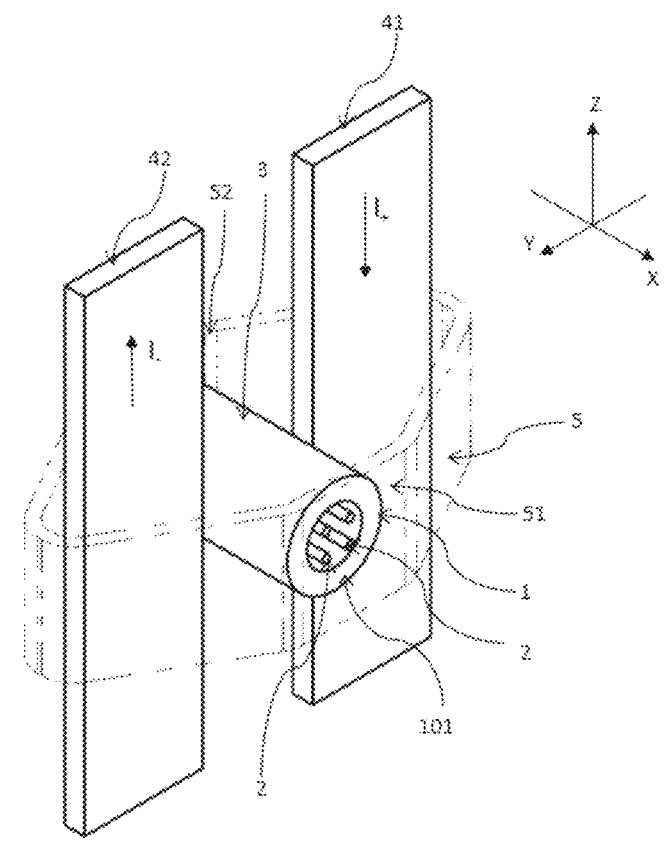

[Fig 4b]

[Fig 5]
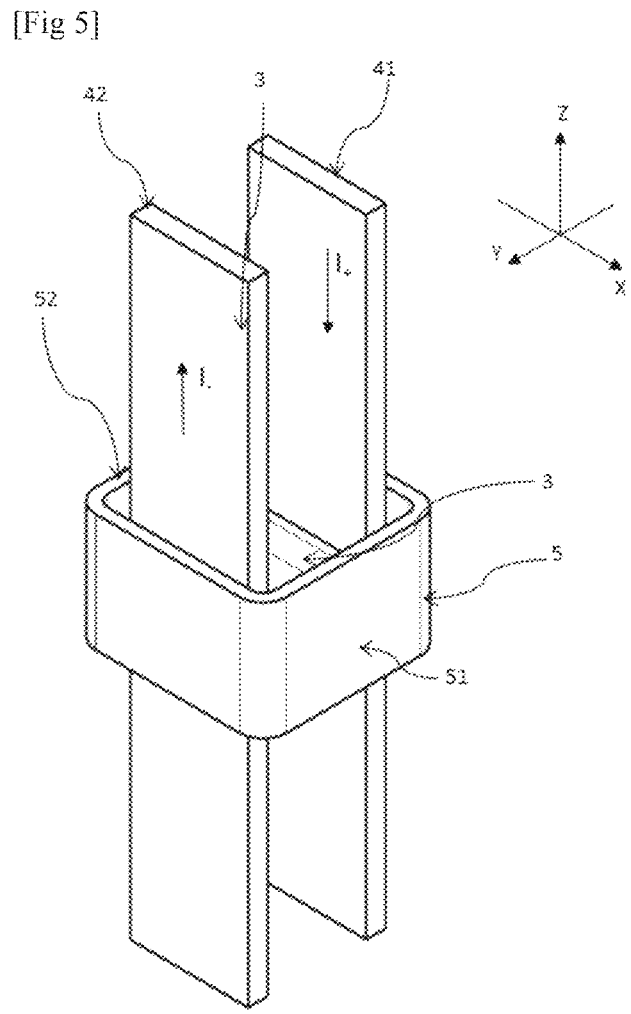

[Fig 6a]
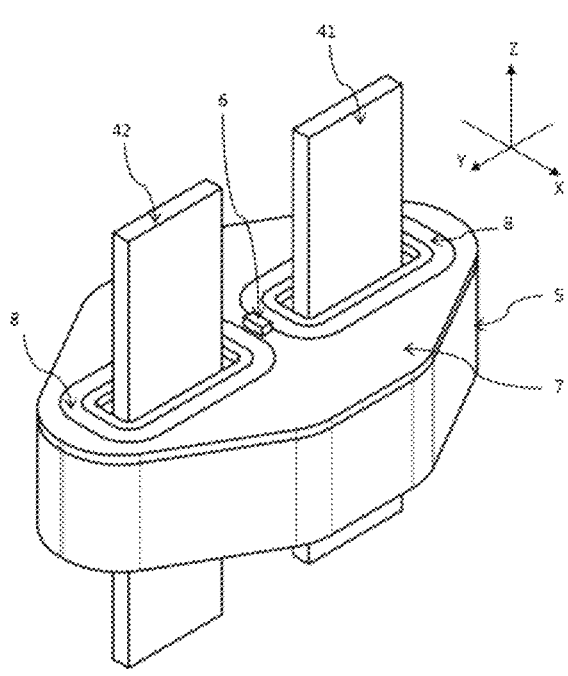
[Fig 6b]
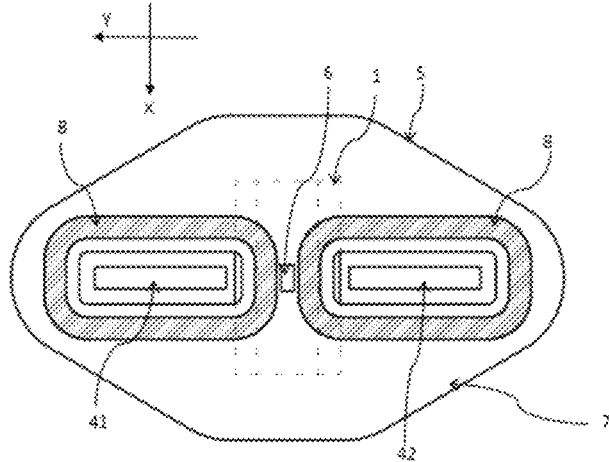

[Fig 7a]
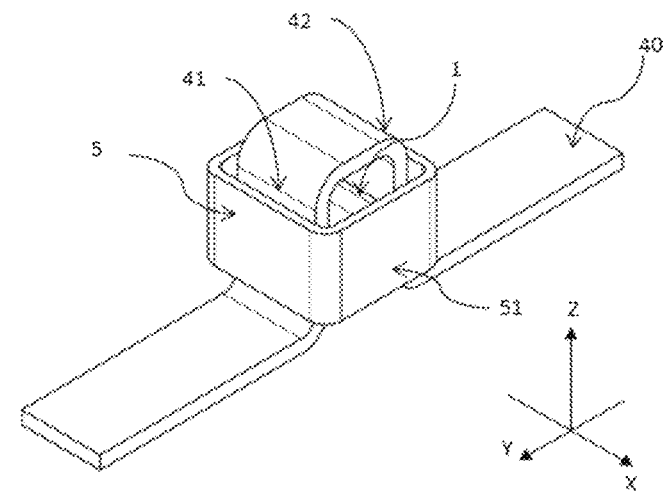
[Fig 7b]
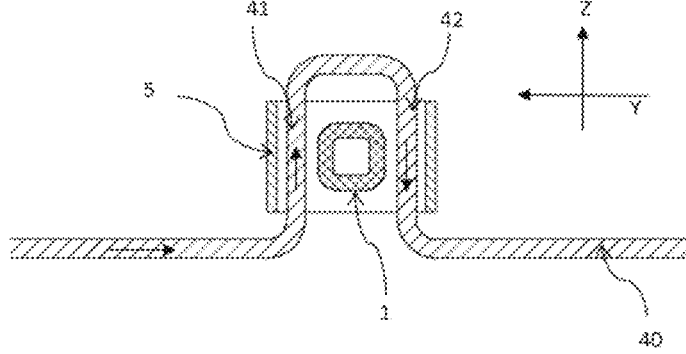

[Fig 7c]
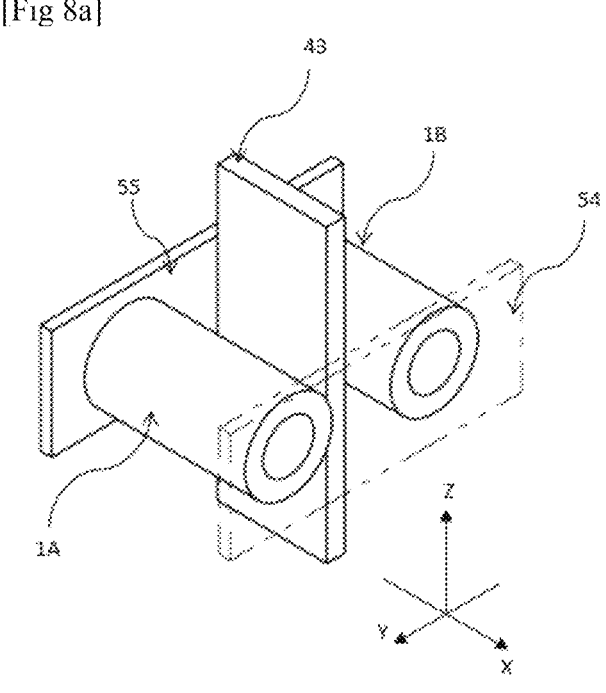
[Fig 8a]
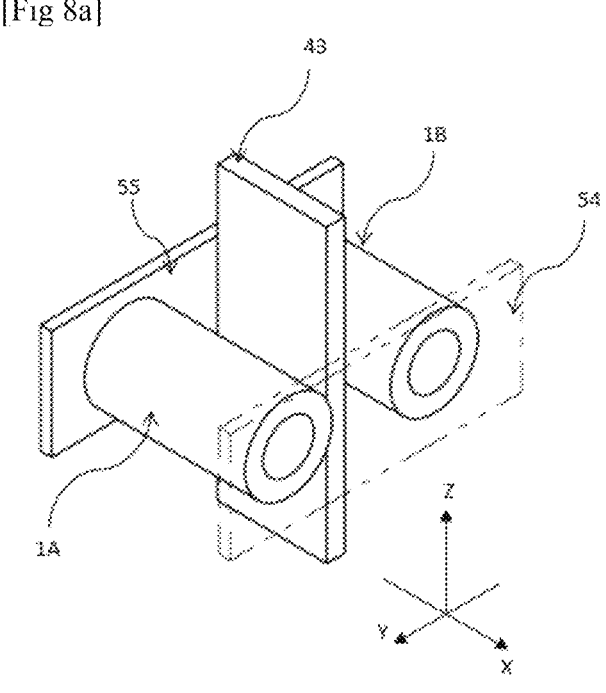

[Fig 8b]
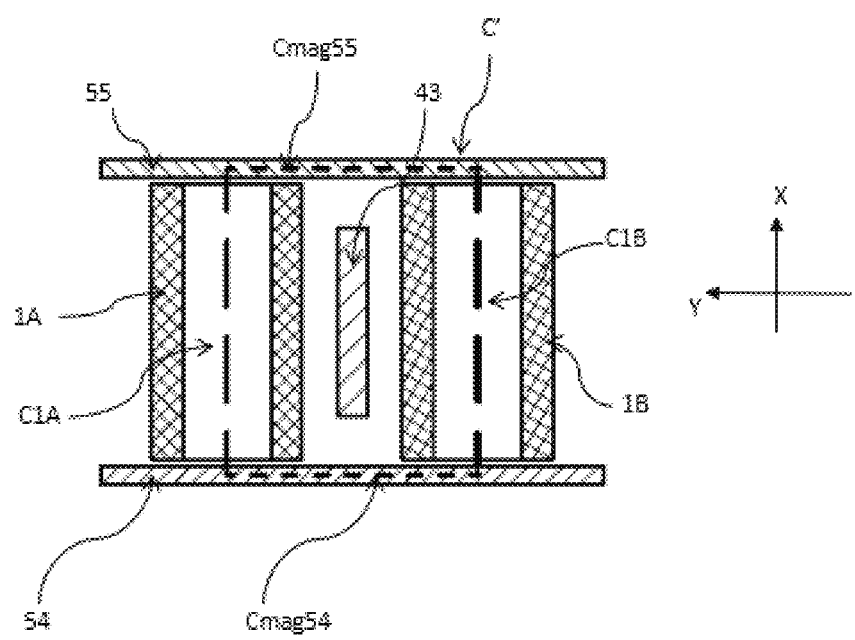
[Fig 9a]
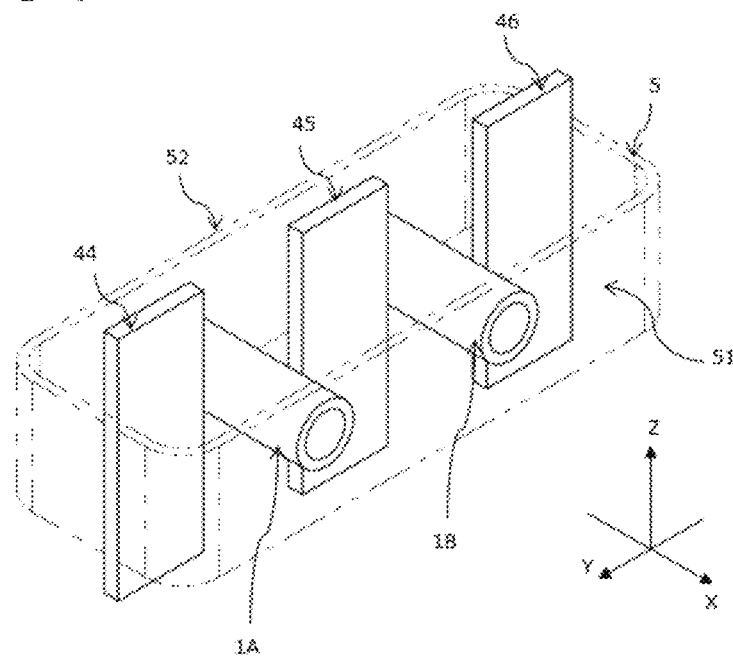

[Fig 9b]
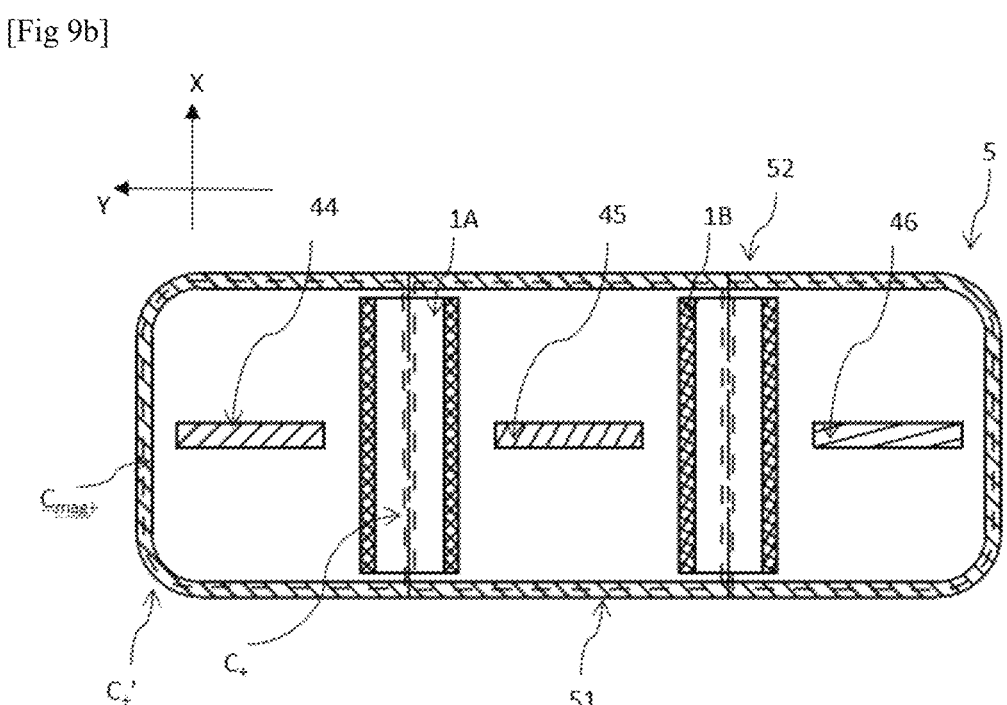

SUPERPARAMAGNETIC TRANSDUCER AND CORRESPONDING MAGNETIC FIELD FLOW SENSOR FOR MEASURING A DIRECT CURRENT

TECHNICAL FIELD

The present invention relates to the field of non-contact measurement of an electric current flowing in a conductor by measuring the flow of the magnetic field induced by this current. The invention relates more particularly to a super-paramagnetic transducer and a magnetic field flow sensor incorporating at least one transducer made of a super-paramagnetic material, suitable for measuring direct current.

PRIOR ART

To measure a current I, different physical principles can be used to generate a physical quantity representative of this current I. For example, the magnetic sensors implement transducers which are sensitive to magnetic quantities, such as the flow of the magnetic field, induced by the current to be measured.

In particular, current sensors are known, implementing the so-called Néel® effect technology described, for example, in the document FR2891917. The distinctive feature of this technology is based on the use of a transducer consisting of coils whose cores are made of a composite loaded with nano-particles having super-paramagnetic properties (SPM).

Conventionally, such a super-paramagnetic transducer (SPM) is formed by a wired conductor wound around and along a flexible and elongated magnetic core. The winding created along the magnetic core provides a dual function as both excitation and measurement coil. It is nevertheless customary to implement suitable feedback means to maintain the flow of the magnetic field in the core at a substantially zero value. The excitation coil may be used to provide the feedback function, but it is also possible to provide a specific winding superimposed on the excitation winding to act as a feedback coil.

The use of this type of transducer has the advantage of not having a magnetic offset, because an SPM material has the distinctive feature of being free of hysteresis.

However, the characteristics of SPM materials are such that it is necessary to make a compromise between measurement dynamics and sensitivity. In fact, the M(H) magnetisation of an SPM material substantially follows a Langevin function.

FIG. 1 shows the relationship between primary field H(A/m) and measured field $H_{mes}$(A/m) with an open loop sensor based on a known SPM material. In the case illustrated in FIG. 1, it is observed that the linearity range is very small, and that the relationship is not bijective, each measured field value being able to correspond to two primary field values. In the example shown in FIG. 1, the linearity range, and therefore the measurement range, is limited to $H_{max}$=1100 A/m.

Thus, the use of SPM material having a low $H_{max}$ value, for example, 1100 A/m, makes it possible to have a good level of sensitivity, but the measurement range remains restricted, and is therefore not suitable for measuring the flow of the field having a large field variation along the measurement contour.

The use of materials having a higher $H_{max}$ value, for example, 10 kA/m, to have a greater linearity range, will however reduce the sensitivity of the transducer, and is therefore not suitable for measuring small currents.

Document EP 3 477 311 B1 proposes a current sensor comprising a magnetic circuit formed around a primary conductor, a probe coil arranged on the magnetic circuit, and a secondary winding that generates, in the magnetic circuit, a magnetic field in a direction that is opposite to a direction of a magnetic field generated by the flux of the primary current. This current sensor is relatively large, and does not make it possible to make any sufficiently precise measurement(s).

The document US 2012/038360 A1 proposes a sensor of the current flowing in an electrical conductor. This sensor comprises a super-paramagnetic core that forms a closed circuit comprising a "U"-shaped core and a hoop, these two elements being detachable in order to be able to insert the conductor inside the magnetic circuit. This sensor, in order to operate, requires a core with a large cross-section, and also a high concentration of SPM material, i.e., a large quantity of SPM material that makes it a very expensive solution.

Document WO 2022/129732 A1 proposes a current sensor comprising a pair of coils each comprising a super-paramagnetic core. The sensor also comprises three means for energising the coils with current, which is heavy to manufacture. In addition, the precision of the measurements of such a sensor is not satisfactory.

SUMMARY OF THE INVENTION

The present invention therefore aims to propose an alternative configuration of direct current or direct magnetic field flow sensor, made of SPM.

In particular, the present invention aims to propose a configuration that takes advantage of the interesting characteristics of SPM transducers with zero-field flow, mainly their absence of magnetic offset, while having a reduced bulk and a cost-effective solution.

SPM Transducer

Thus, the invention provides an SPM super-paramagnetic material transducer comprising:

at least one SPM coil formed by a core with a longitudinal axis made of SPM around which at least one electrical conductor is wound, along the longitudinal axis; and at least one feedback winding CR.

According to the invention, the SPM transducer further comprises:

a rigid body with a longitudinal central axis, and two planar surfaces at each of the opposite ends of the body in the direction of the longitudinal central axis, these planar surfaces being substantially perpendicular to the longitudinal central axis;

at least one support channel formed in the body and in which the SPM coil is housed, the support channel extending parallel to the longitudinal central axis and opening onto both planar surfaces.

Furthermore, the feedback winding is formed by an electric conductor wound on the external surface of the body and along the longitudinal central axis.

Thus, the SPM transducer of the invention is of a finite size and is formed by a rigid body configured to carry the feedback winding on its external surface, as well as the SPM coil(s) in a channel or channels formed in its internal volume.

This configuration is different from that of the prior art, that is generally in the form of a long flexible cable, the excitation, measurement and feedback conductors being successively wound in layers around the SPM core.

The body may be in the form of a cylinder. The length of the body, in the direction of the longitudinal central axis, may measure from a few centimetres to approximately ten centimetres.

Advantageously, the transducer comprises several distinct support channels, for example, two, each channel housing an SPM coil. The support channels extend parallel to the longitudinal central axis and are arranged in the body around the longitudinal central axis, each channel opening at both planar surfaces of the body.

Advantageously, both planar surfaces form an external volume with the external surface of the body, the feedback winding being contained in this external volume.

According to an embodiment, the body is formed by a first sub-structure comprising the support channel(s) and a second hollow sub-structure comprising both planar surfaces as well as the external surface supporting the feedback coil.

The first sub-structure is inserted into the hollow volume of the second sub-structure. In particular, the first sub-structure is formed by a rigid support body in which the support channels are hollowed, which are open radially towards the external surface of the body of the first sub-structure, and which open at both ends of said body of the first sub-structure.

Field Flow Sensor

The invention also relates to a magnetic field flow sensor for measuring a direct current, formed by at least one SPM super-paramagnetic material transducer intended to be subjected to an external magnetic field to be measured, the magnetic field being induced by a current traversing a primary conductor formed by at least one electrical conductor of which at least a portion extends along a Z axis.

According to the invention, the sensor comprises, at least:

an SPM transducer having a longitudinal central axis X and two opposite free ends along the longitudinal central axis X, the SPM transducer being formed by a feedback winding CR coupled to at least one SPM coil extending between both free ends;

a magnetic circuit having at least two planar surfaces parallel to one another and perpendicular to the longitudinal central axis X, both planar surfaces being positioned opposite the respective free ends of the transducer. Furthermore, according to the invention, the sensor is intended to be positioned relative to the primary conductor such that said Z axis is perpendicular to the longitudinal axis X and parallel to the planar surfaces.

In practice, the portion of the primary conductor is intended to be traversed by a current. The SPM transducer is formed by one or more SPM coils extending along a longitudinal axis, and connected to a feedback coil. The feedback winding CR is formed by a winding of an electrical conductor created around the assembly formed by SPM coils. The portion of the primary conductor is positioned in the vicinity, as close as possible to the SPM transducer. In practice, the portion of the primary conductor and the SPM transducer are preferably separated only by an electrical insulator. Both planar surfaces of the magnetic circuit are positioned opposite one another and as close as possible to the free ends of the SPM transducer. Similarly, both planar surfaces of the magnetic circuit are preferably separated from the free ends of the SPM transducer only by an electrical insulator.

In practice, the magnetic circuit encloses or surrounds the assembly formed by the SPM transducer and the portion of the primary conductor so as to form flow contour of the magnetic field. This flow contour is contained in a plane parallel to the longitudinal central axis X, surrounds the portion of the primary conductor and longitudinally traverses the SPM transducer traversing both planar surfaces of the magnetic circuit. Thus, the SPM transducer acts as a field flow sensor.

According to one embodiment, the structure of the SPM transducer is similar to the structure of the SPM transducer of the invention as described above. In practice, both planar surfaces of the first primary circuit therefore face both planar surfaces of the SPM transducer.

In accordance with another embodiment, the primary conductor may comprise:

a primary conductor referred to as an "outward" conductor, for the flow of a current I+ in a direction along a vertical axis Z perpendicular to the longitudinal central axis X; and a primary conductor referred to as a "return" conductor, for the flow of a current I- in the opposite direction.

For such a primary conductor, the SPM transducer is advantageously arranged between both outward and return primary conductors along a lateral axis Y perpendicular to both axes X and Z. The magnetic circuit thus surrounds the assembly of outward and return primary conductors and SPM transducer, forming a contour perpendicular to the flow direction of currents I+ and I-.

According to another embodiment, the outward and return primary conductors may be formed by two branches of a single electrical conductor having a substantially U-shaped profile. For such a primary conductor, the transducer SPM is arranged between both branches.

According to another embodiment, the primary conductor may be a single conductor. In this case, the sensor may comprise two SPM transducers arranged on either side of the single primary conductor and extending parallel along the longitudinal central axis X. In addition, the magnetic circuit may be in the form of two plates forming both planar surfaces, a first plate being positioned opposite the free ends of both SPM transducers and a second plate being positioned opposite the other free ends of both SPM transducers.

According to another embodiment, for three primary conductors, the sensor may comprise two SPM transducers positioned alternately with said primary conductors along a lateral axis Y perpendicular to the longitudinal central axis X and to the axis Z, the magnetic circuit surrounding the assembly formed by the three primary conductors and both SPM transducers.

The sensor may further comprise a Hall effect sensor, and/or Rogowski coils around each primary conductor.

BRIEF DESCRIPTION OF THE FIGURES

Other characteristics and advantages of the present invention will be more clearly understood from the description below, made with reference to the accompanying drawings given by way of non-limiting examples, in which:

FIG. 1 is a curve demonstrating the relationship between primary field H(A/m) and measured field $H_{mes}$(A/m) with an open loop sensor based on a known SPM material;

FIG. 2a is a diagrammatic view of an SPM transducer according to an embodiment of the invention;

FIG. 2b is a cross-sectional view along the cross-sectional plane A-A of the transducer in FIG. 2a;

FIG. 3a is a diagrammatic view of an SPM transducer according to another embodiment of the invention;

FIG. 3b is a diagrammatic view of the body provided with support channels for the SPM coils belonging to the SPM transducer in FIG. 3a;

FIG. 4a is a diagrammatic view of a sensor according to an embodiment of the invention;

FIG. 4b is a cross-sectional top view of the sensor in FIG. 4a, the magnetic circuit being shown diagrammatically with a rectangular profile;

FIG. 5 is a diagrammatic view of a sensor according to another embodiment of the invention;

FIG. 6a is a diagrammatic view of the sensor according to another embodiment incorporating Rogowski coils and a Hall effect sensor;

FIG. 6b is a top view of the sensor in FIG. 1.

FIG. 7a is a diagrammatic view of a sensor according to another embodiment of the invention in which the primary conductor comprises a U-shaped section;

FIG. 7b is a longitudinal cross-sectional view of the sensor in FIG. 7a;

FIG. 7c is a cross-sectional top view of the sensor in FIG. 7a;

FIG. 8a is a diagrammatic view of a sensor according to another embodiment of the invention in which the primary conductor is arranged between two SPM transducers;

FIG. 8b is a cross-sectional top view of the sensor in FIG. 8a;

FIG. 9a is a diagrammatic view of a sensor according to another embodiment of the invention adapted for three primary conductors;

FIG. 9b is a cross-sectional top view of the sensor in FIG. 9a.

DESCRIPTION OF THE EMBODIMENTS

An SPM transducer according to one embodiment is illustrated in FIGS. 2a and 2b.

This SPM transducer 1 is formed by a body with a longitudinal central axis X. The body may thus be in the form of a solid cylinder, for example, made of a rigid plastic material.

The body 10 thus has an external surface 100, an internal volume and two planar surfaces 101, 102 at each of its opposite ends in the direction of the longitudinal central axis X. Both planar surfaces 101, 102 extend substantially perpendicular to the longitudinal central axis X.

Separate support channels 103 are formed in the internal volume of the body 10, in practice, one pair, for example, four support channels. Each support channel 103 is configured to house an SPM coil 2. The support channels 103 extend parallel to the longitudinal central axis X and are arranged in the body 10, around the axis X, symmetrically relative to one another or not, each channel 103 opening at both planar surfaces 101, 102 of the body 10.

Thus, the SPM coils 2 arranged in these channels 103 extend parallel to the longitudinal central axis X and also open at both planar surfaces 101, 102 of the body. Each SPM coil 2 is, in particular, formed by a flexible core 20 with a longitudinal axis made of SPM around which at least one electrical conductor 21 is wound, along the longitudinal axis of the core 20.

The cores 20 of the SPM coils 2 may have a cross-section that is less than or equal to 5 mm², preferably less than or equal to 1 mm². The cores 20 of the SPM coils 2 may have a concentration by volume of SPM material that is less than 10%, preferably between 1 and 4%. These arrangements make it possible to reduce the use of SPM materials, which are particularly expensive.

A feedback winding 3 formed by an electrical conductor is wound on the external surface 100 of the body 10 along the longitudinal central axis X.

In the example shown in FIGS. 2a and 2b, the planar surfaces 101, 102 may be in the form of a coil flange or disc with a diameter greater than that of the body 10. Both of these planar surfaces 101, 102 thus form an external volume with the external surface 100 of the body 10, in which the feedback winding 3 is arranged. In other words, the transducer is in the form of a spool or tube for a cable reel, the feedback winding being held axially via the rims or flanges, and the SPM coils being housed in the tube.

An SPM transducer in accordance with another embodiment is illustrated in FIGS. 3a and 3b. In this embodiment, the body 10 is formed by a first sub-structure 10a comprising the support channels 103 of the SPM coils and of a second hollow sub-structure 10b comprising both planar surfaces 101, 102 as well as the external surface 100 supporting the feedback winding. The first sub-structure 10a is inserted into the hollow volume of the second sub-structure 10b. In particular, the first sub-structure 10a is formed by a rigid support body in which the support channels are hollowed, which are open radially towards the external surface of the body, and which open at both ends of the body.

Figure 4B:
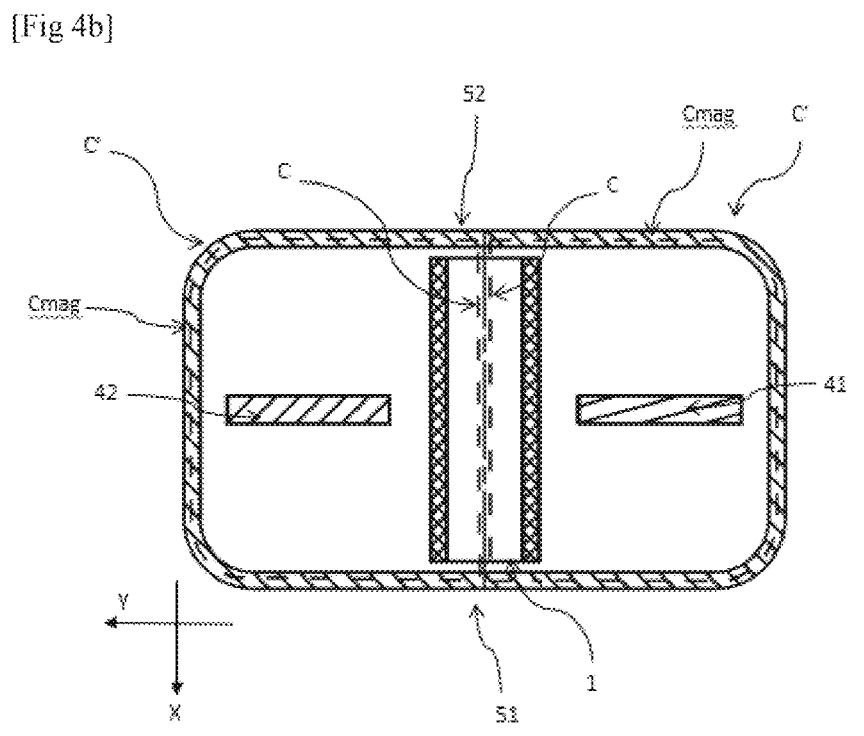

A magnetic field flow sensor for direct current measurement according to one embodiment is illustrated in FIGS. 4a, 4b and 5. This current sensor comprises an SPM transducer 1 that may have a structure similar to the transducer described above and that extends along a longitudinal axis X. The SPM transducer 1 is, in particular, in the form of a cylindrical body carrying on the outside a feedback winding 3 and on the inside a device for measuring the flow of the magnetic field in the form of SPM coils 2, for example, two pairs of SPM coils.

This sensor is configured to be positioned around a portion of a first electrical conductor that may be formed by a primary conductor referred to as an "outward" conductor 41 and a primary conductor referred to as a "return" conductor 42, through which currents I+ and I−, respectively, flow in opposite directions. Both the outward and return primary conductors 41, 42 extend perpendicularly to the longitudinal axis X in a direction along a Z axis and are arranged on either side of the SPM transducer along a lateral axis Y perpendicular to the X and Z axes. The Z axis is vertical relative to the sensor shown in the figure.

The magnetic circuit 5 surrounds the outward and return primary conductor 41, 42 and SPM transducer 1 assembly, forming a contour perpendicular to the flow direction of the currents I+ and I−. The magnetic circuit 5 comprises two portions or planar surfaces 51, 52 positioned opposite the respective free ends 101, 102 of the SPM transducer 1, these free ends 101, 102 advantageously being planar surfaces as described above. The height (along the Z axis) and the length (along the Y axis) of a planar surface 51, 52 of the magnetic circuit 5 are such that the planar surface 51, 52 covers at least the planar surface of the free end of the SPM transducer. The size of the planar surface 51, 52 may be a result of a compromise between performance and volume of magnetic material affecting the price, size and weight of the sensor. In practice, an electrical insulator is interposed between the various elements of the sensor, such that the magnetic circuit is preferably bonded to the electrical insulator, in order to be as close as possible to the primary conductor and SPM transducer assembly.

Thus, in this embodiment, the pair of outward and return primary conductors 41, 42 is surrounded by a magnetic circuit 5 having at least two planar surfaces 51, 52 parallel to one another. An SPM transducer 1 consisting of rectilinear SPM coils is inserted between both outward and return primary conductors 41, 42 so as to create an open measurement contour C connecting both planar surfaces 51, 52 of the magnetic circuit 5. In this case, the open measurement contour C (FIG. 4*b*) is similar to a path passing at both ends of the SPM transducer and extending in the X axis.

In practice, the outward primary conductor 41 is traversed by a current $I_+=I_P$ that may vary in normal use between values $-I_{max}$ and $+I_{max}$, and the return primary conductor 42 is traversed by a current $I_-=-I_p$. The feedback winding 3 is traversed by a current $I_{CR}$, and is formed by a winding of N turns wound around a hollow support containing conventional SPM coils 2 for measuring the flow cir of a magnetic field H on the open contour C. The flow cir is expressed by the equation:

$$cir = \oint_C \overrightarrow{H}\overrightarrow{dl}$$

The feedback current $I_{CR}$ is preferably permanently adjusted so as to obtain a flow cir=0, such that $N \cdot I_{CR}=-I_p$.

The SPM material is preferably a high-sensitivity SPM material characterised by a maximum field of use $H_{max}$ substantially less than the maximum field $H_{pmax}$ generated by the primary conductors.

The shape and dimensions of the magnetic circuit and the feedback coil are preferably adjusted so as to obtain fluctuations of the magnetic field along the open contour C less than the maximum field of use $H_{max}$, when cir=0 and $I_p=I_{Pmax}$.

By way of example, the open contour C is preferably of reduced length, for example, approximately 50 mm. Both planar surfaces 51, 52 of the magnetic circuit 5 may thus be considered as spaced apart by about 50 mm along the X axis.

If a closed contour C' is considered, consisting, on the one hand, of the open contour C and a contour portion $C_{mag}$ connecting both planar surfaces 51, 52 and surrounding the outward primary conductor 41 or return primary conductor 42, then Ampere's theorem results in:

$$\oint_{C'} \overrightarrow{H}\overrightarrow{dl} = \oint_C \overrightarrow{H}\overrightarrow{dl} + \oint_{C_{mag}} \overrightarrow{H}\overrightarrow{dl} = I_P;$$

with H the magnetic field, and $I_P$, the current flowing in the primary conductor considered.

If the relative permeability μr and/or the thickness of the magnetic material is sufficiently high, the second term may be ignored, so as to consider only:

$$\oint_C \overrightarrow{H}\overrightarrow{dl} = I_P$$

Furthermore, if the feedback winding that surrounds the SPM coils is traversed by a current generating $I_{CR}$ Ampere revolutions, thus:

$$\oint_C \overrightarrow{H}\overrightarrow{dl} = I_P + I_{CR}$$

When the flow sensor, i.e., the SPM transducer, provides a zero value, it is possible to state that: $I_{CR}=-I_P$.

The feedback winding must thus be capable of generating 500 A·t for a primary current of 500 A, and the average filling rate of a winding is approximately $K_r$=0.6. If we limit ourselves to a current density of $J_{max}$=5 A/mm², it will therefore be preferable to have a minimum winding cross-section $S_{Coil}$ of:

$$S_{Bobine} = \frac{I_{pmax}}{K_r J_{max}} = \frac{500}{5 \times 0.6} = 167 \text{ mm}^2$$

That is to say a coil thickness of between 3 and 4 mm.

Such a feedback winding of 3 to 4 mm is difficult to produce directly on an SPM coil of the prior art that is conventionally produced on a core of small cross-section, of approximately 1 mm.

The invention thus proposes a new configuration in which the feedback is generated by means of a coil with a larger cross-section, whose winding core is hollow and may accommodate the SPM measurement windings, as shown in FIGS. 2*a* to 3*b*.

By correctly adjusting the geometrical parameters of the magnetic circuit 5 and the feedback coil 3, it is possible to reduce any fluctuation(s) of the fields along the open contour C.

The material of the magnetic circuit is preferably made of a material with high permeability and a low coercive field (for example, based on 80% FeNi). In fact, the absence of any magnetic offset of the SPM coils does not mean the absence of any magnetic offset of the device. The material of the SPM core is characterised by its coercive field $H_C$, and in the absence of current, we have:

$$\oint_C \overrightarrow{H}\overrightarrow{dl} + \oint_{C_{mag}} \overrightarrow{H}\overrightarrow{dl} = 0$$

The field inside the material is between $+H_C$ and $-H_C$, therefore, it is possible to state:

$$\left| \oint_{C_{mag}} \overrightarrow{H}\overrightarrow{dl} \right| < \oint_{C_{mag}} \overrightarrow{H_C}\overrightarrow{dl} = H_c l_{mag}$$

where $l_{mag}$ is the length of the magnetic circuit 5 making it possible to close the contour C.

The resulting current $I_0$ may therefore be limited by $I_0 < H_c l_{mag}$

Thus, to reduce $I_0$, it is possible to choose a material with a low coercive field, for example, an FeNi type alloy with 80% Ni for $H_c$=0.6 A/m In addition, to reduce$_{mag}$, one solution involves orientating the outward and return primary conductors as in FIG. 5, when these conductors have rectangular cross-sections. In this manner, the magnetic circuit 5 is more compact.

In certain applications, it may also be advantageous, in particular, for protection purposes, to be able to measure overload currents greater than the maximum current compensable by the feedback current. To this end, as shown in FIGS. 6*a* and 6*b*, it is possible to arrange a Hall-effect sensor 6 between both primary conductors 41, 42. This Hall effect sensor 6 will advantageously be supported by a printed circuit 7 configured to connect the SPM transducer.

Finally, short-circuit currents may be measured by devices of the Rogowski coil or winding 8 type. Thus, advantageously, the sensor may integrate one or more Rogowski coils 8, each placed around one of the primary conductors 41, 42.

These Rogowski coils 8 may advantageously be integrated into the printed circuit 8. By way of example, the Rogowski coil in the form of a printed circuit described in document EP 3 268 754 and/or the Hall-effect sensor described in document FR 2 947 060 may be implemented in the sensor of the invention, without these examples being limiting since any type of commercially available sensor may be suitable.

According to another embodiment shown in FIGS. 7a-7c, the primary outward and return conductors 41, 42 may be formed by two branches of a single electrical conductor 40 having a substantially U-shaped profile. The SPM transducer 1 is arranged between both branches of the U, and the magnetic circuit 5 surrounds both branches. Thus, it is possible to identify two flow contours $C_1'$ and $C_2'$ for measurement purposes. A first contour $C_1'$ for flow of the field surrounding a branch 41 of the primary conductor is formed by an open contour C and an open contour $C_{mag1}$. The measurement contour C passes along the SPM transducer 1 and connects both planar surfaces 51, 52 of the magnetic circuit 5, and the contour $C_{mag1}$ flows across a portion of the magnetic circuit connecting both planar surfaces 51, 52 and surrounds a branch of the primary conductor. A second contour $C_2'$ for flow of the field surrounding another branch 42 of the primary conductor, is formed by the open contour C and a second open contour Cmag2 flowing on another portion of the magnetic circuit 5 connecting both planar surfaces 51, 52 and surrounding the other branch of the primary conductor.

According to another embodiment shown in FIGS. 8a and 8b, the primary conductor is formed by a single conductor 43 arranged between two SPM transducers 1A and 1B. Both SPM transducers 1A, 1B are substantially identical. The magnetic circuit is formed by two plates 54, 55, forming both planar surfaces. A first plate 54 is positioned opposite one of the free ends of both SPM transducers 1A, 1B and a second plate 55 is positioned opposite the other free ends of both SPM transducers 1A, 1B. As shown in FIG. 8b, the measurement contour C' is formed by both contours C1A and C1B flowing along both respective SPM transducers 1A and 1B and the contours Cmag54 and Cmag55 flowing in the respective plates 54 and 55. The contour C' is thus a closed contour surrounding the primary conductor 43.

In certain types of direct current applications, the number of primary conductors may be three: a first primary conductor $P_0$ serving, in particular, as a reference (0 Volt), a second primary conductor $P_+$, intended to be traversed by a current $I_+$, and a third primary conductor $P_-$, intended to be traversed by a current $I_-$, the direction of which is opposite to the current $I_+$. In practice, the currents $I_+$ and $I_-$ do not necessarily have the same amplitude, such that there may be a current $I_0$ in the first primary reference conductor, such that $I_0+I_++I_-=0$ in the absence of a leakage current.

The configuration shown in FIGS. 9a and 9b makes it possible to solve this problem, according to the same principle as the previous embodiments. Thus, three primary conductors 44, 45 and 46 are arranged alternately with two SPM transducers 1A, 1B, and a magnetic circuit 5 surrounding the assembly. Thus, each SPM transducer 1A, 1B is arranged between two primary conductors 44, 45, 46, and extends parallel to the axis X. Furthermore, as for the previous embodiments, the magnetic circuit 5 (drawn in dotted lines in FIG. 9a) comprises two planar surfaces 51, 52 positioned opposite both free ends of the SPM transducers so as to form the different contours.

The first primary conductor 44 may be the conductor $P_+$ intended to be traversed by a current $I_+$, the second conductor 45 may be the reference conductor $P_0$, and the third conductor 46 may be the conductor $P_-$ intended to be traversed by a current $I_-$.

If the flow sensor is placed between the conductors $P_+$ and $P_0$, i.e., the SPM transducer 1A, the field flow measured on the path formed by the contour $C_+'$ formed by the path $C_+$ along the SPM transducer 1A and by the path $C_{mag+}$ through the left-hand portion of the magnetic circuit 5 to surround the conductor $P_+$, in the absence of any feedback current, this results in:

$$\oint_{C_+} \vec{H}\vec{dl} + \oint_{C_{mag+}} \vec{H}\vec{dl} = I_+$$

Because the flow in the material of the magnetic circuit may be considered negligible, the flow measured on the path $C_+$ is thus substantially equal to $I_+$. When the same number of ampere revolutions are applied in the feedback, zero flow is obtained. The same reasoning applies to the SPM transducer 1B placed between the conductors $P_0$ and $P_-$.

The present invention is clearly not limited to the exemplary embodiments described, but encompasses any modifications and variations within the scope of the accompanying claims which are obvious to a person skilled in the art. Furthermore, the technical characteristics of the various embodiments and variants mentioned above can be combined in their entirety or only in part.

The invention claimed is:

1. A magnetic field flow sensor for measuring a direct current, formed by at least one super-paramagnetic material transducer intended to be subjected to an external magnetic field to be measured induced by a current traversing a primary conductor formed by at least one electrical conductor of which at least a portion extends along an axis, characterised in that the sensor comprises at least:

a super-paramagnetic material transducer comprising:

at least one super-paramagnetic coil formed by a core with a longitudinal axis made of super-paramagnetic material around which at least one electrical conductor is wound, along the longitudinal axis; and at least one feedback winding;

a rigid body with a longitudinal central axis, and two planar surfaces at each of the opposite ends of the body in the direction of the longitudinal central axis, both of these planar surfaces being substantially perpendicular to the longitudinal central axis;

at least one support channel formed in the body and in which the super-paramagnetic coil is housed, the support channel extending parallel to the longitudinal central axis and opening onto both planar surfaces;

and characterised in that the feedback winding is formed by an electrical conductor wound onto the outer surface of the body and along the longitudinal central axis, said transducer having two opposite free ends along the longitudinal central axis, the super-paramagnetic transducer being formed by the feedback winding coupled to said at least one super-paramagnetic coil extending between both free ends;

and wherein said sensor comprises:

a magnetic circuit having at least two planar surfaces parallel to one another and perpendicular to the longitudinal central axis, both planar surfaces being positioned opposite the respective free ends of the super-paramagnetic transducer; and in that said sensor is positioned relative to said primary conductor such that said axis is perpendicular to the longitudinal axis and parallel to said planar surfaces.

2. The magnetic field flow sensor according to claim 1, characterised in that the transducer further comprises several distinct support channels, each channel housing a super-paramagnetic coil, the support channels extending parallel to the longitudinal central axis and being arranged in the body around the longitudinal central axis, each channel opening at both planar surfaces of the body.

3. The magnetic field flow sensor according to claim 1, characterised in that the core of said at least one super-paramagnetic coil has a cross-section of less than or equal to 5 mm², and a super-paramagnetic material volume concentration of less than 10%.

4. The magnetic field flow sensor according to claim 1, characterised in that both planar surfaces form an external volume with the external surface of the body, the feedback winding being contained in this external volume.

5. The magnetic field flow sensor according to claim 1, characterised in that the body is formed by a first substructure comprising said at least one support channel and a second hollow sub-structure comprising both planar surfaces as well as the external surface supporting the feedback winding, the first sub-structure being inserted into the hollow volume of the second sub-structure, said at least one support channel being open radially towards the external surface of the body of the first sub-structure and opening at both ends of said body of the first sub-structure.

6. The magnetic field flow sensor according to claim 1, characterised in that for a primary conductor comprising:

a primary conductor referred to as an "outward" conductor, for the flow of a current in a direction along the axis; and a primary conductor referred to as a "return" conductor, for the flow of a current in the opposite direction;

the super-paramagnetic transducer is arranged between both of the primary outward and return conductors along a lateral axis perpendicular to the longitudinal central axis and to the axis, the magnetic circuit surrounding the assembly of primary outward and return conductors and super-paramagnetic transducer, forming a field flow contour perpendicular to the flow direction of the currents.

7. The magnetic field flow sensor according to claim 6, characterised in that for outward and return primary conductors formed by both branches of a single electrical conductor having a substantially U-shaped profile, the super-paramagnetic transducer is arranged between both branches.

8. The magnetic field flow sensor according to claim 1, characterised in that, for a single primary conductor, two super-paramagnetic transducers are arranged on either side of the primary conductor and extend parallel along the longitudinal central axis, and the magnetic circuit comprises two plates forming both planar surfaces, one of the plates being positioned opposite the free ends of both super-paramagnetic transducers, and the other plate being positioned opposite the other free ends of both super-paramagnetic transducers.

9. The magnetic field flow sensor according to claim 1, characterised in that, for three primary conductors, the sensor comprises two super-paramagnetic transducers positioned alternately with said primary conductors along a lateral axis perpendicular to the longitudinal central axis and to the axis, the magnetic circuit surrounding the assembly formed by the three primary conductors and both super-paramagnetic transducers.

10. The magnetic field flow sensor according to claim 1, characterised in that the sensor further comprises a Hall effect sensor and/or Rogowski coils around each primary conductor.

* * * * *